US012683582B2

(12) United States Patent　　　(10) Patent No.: US 12,683,582 B2

Fujimori　　　　　　　　　　　　　(45) Date of Patent: Jul. 14, 2026

(54) ACOUSTIC WAVE DEVICE INCLUDING CONDUCTIVE SHIELD LAYER

(71) Applicant: Murata Manufacturing Co., Ltd., Nagaokakyo (JP)

(72) Inventor: Eiji Fujimori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 152 days.

(21) Appl. No.: 18/771,366

(22) Filed: Jul. 12, 2024

(65) Prior Publication Data

US 2024/0364306 A1　　　Oct. 31, 2024

Related U.S. Application Data

(63) Continuation of application No. PCT/JP2023/002066, filed on Jan. 24, 2023.

(30) Foreign Application Priority Data

Mar. 7, 2022　(JP) ................................. 2022-034596

(51) Int. Cl.
　　*H03H 9/25*　　　(2006.01)
　　*H03H 9/13*　　　(2006.01)
　　　　(Continued)

(52) U.S. Cl.
　　CPC .............. *H03H 9/25* (2013.01); *H03H 9/131* (2013.01); *H03H 9/6483* (2013.01); *H03H 9/725* (2013.01)

(58) Field of Classification Search
　　CPC ........ H03H 9/25; H03H 9/131; H03H 9/6483; H03H 9/725
　　　　(Continued)

(56) References Cited

U.S. PATENT DOCUMENTS

2016/0142041 A1　　5/2016　Kuwahara
2017/0331455 A1　　11/2017　Kuroyanagi
　　　　(Continued)

FOREIGN PATENT DOCUMENTS

JP　　2006060747 A　　3/2006
JP　　2015070489 A　　4/2015
　　　　(Continued)

OTHER PUBLICATIONS

International Search Report in PCT/JP2023/002066, mailed Apr. 18, 2023, 3 pages.
　　　　(Continued)

*Primary Examiner* — Andrea Lindgren Baltzell
*Assistant Examiner* — Victor Cole
(74) *Attorney, Agent, or Firm* — Keating & Bennett, LLP

(57)　　　　ABSTRACT

An acoustic wave device includes a piezoelectric substrate including an outer terminal electrode and first and second main surfaces, a filter including a resonator on the first main surface, and a conductive shield layer. The outer terminal electrode includes first and second terminals and a ground terminal. The filter is connected to the first and second terminals. The shield layer is above the resonator to overlap with at least a portion of the resonator in a case where the piezoelectric substrate is viewed in a plan view in a thickness direction of the piezoelectric substrate. The resonator includes an electrode electrically connected to the first or second terminal and an electrode connected to the ground terminal with the shield layer interposed between the electrode and the ground terminal.

19 Claims, 12 Drawing Sheets

(51) Int. Cl.
  H03H 9/64    (2006.01)
  H03H 9/72    (2006.01)

(58) Field of Classification Search
  USPC ...................... 333/186, 187, 193; 310/313 R
  See application file for complete search history.

(56)      References Cited

U.S. PATENT DOCUMENTS

| | | | |
|---|---|---|---|
| 2017/0346463 A1 * | 11/2017 | Hatakeyama | ............ H03H 9/64 |
| 2018/0019727 A1 * | 1/2018 | Ando | .................... H10N 30/88 |
| 2023/0063980 A1 | 3/2023 | Li et al. | |

FOREIGN PATENT DOCUMENTS

| | | |
|---|---|---|
| JP | 2016096439 A | 5/2016 |
| JP | 2017204827 A | 11/2017 |
| WO | 2021164215 A1 | 8/2021 |

OTHER PUBLICATIONS

Written Opinion in PCT/JP2023/002066, mailed Apr. 18, 2023, 3 pages.

\* cited by examiner

ACOUSTIC WAVE DEVICE INCLUDING CONDUCTIVE SHIELD LAYER

CROSS REFERENCE TO RELATED APPLICATIONS

This application claims the benefit of priority to Japanese Patent Application No. 2022-034596 filed on Mar. 7, 2022 and is a Continuation application of PCT Application No. PCT/JP2023/002066 filed on Jan. 24, 2023. The entire contents of each application are hereby incorporated herein by reference.

BACKGROUND OF THE INVENTION

1. Field of the Invention

The present disclosure relates to acoustic wave devices, and more specifically, to technologies for reducing or preventing decreases in filter characteristics in the acoustic wave devices including acoustic wave filters.

2. Description of the Related Art

Japanese Unexamined Patent Application Publication No. 2017-204827 discloses a configuration in which two substrates on which acoustic wave resonators are disposed are laminated such that the acoustic wave resonators face each other in an acoustic wave device.

SUMMARY OF THE INVENTION

In the acoustic wave device as disclosed in Japanese Unexamined Patent Application Publication No. 2017-204827, a ground electrode serving as a reference potential is generally disposed on a mounting substrate on which the acoustic wave device is mounted. In the case of the laminated acoustic wave device as described above, in particular, a path length from a filter device formed on the substrate laminated on the upper side to the ground electrode is relatively long. In this case, a signal of the filter device on the lower side is easily electromagnetically coupled, and the filter characteristics such as the isolation characteristics between the filter devices may be decreased.

Example embodiments of the present invention reduce or prevent decreases in filter characteristics in acoustic wave devices including acoustic wave filters.

An acoustic wave device according to an example embodiment of the present disclosure includes a first piezoelectric substrate including an outer terminal electrode, a first surface and a second surface, a first filter including a first resonator on the first surface, and a conductive shield layer. The outer terminal electrode includes a first terminal, a second terminal, and a ground terminal. The first filter is connected to the first terminal and the second terminal. The shield layer is above the first resonator to overlap with at least a portion of the first resonator in a case where the first piezoelectric substrate is viewed in a plan view in a thickness direction of the first piezoelectric substrate. The first resonator includes a first electrode electrically connected to the first terminal or the second terminal, and a second electrode connected to the ground terminal with the shield layer interposed between the second electrode and the ground terminal.

In the acoustic wave devices according to example embodiments of the present disclosure, one electrode (second electrode) of the first resonator of the first filter is connected to the ground terminal with the shield layer disposed close to the first resonator to cover the first resonator interposed therebetween. With such a configuration, since the loop area of the signal path leading to the ground electrode through the first resonator can be reduced, the electromagnetic coupling between the filters can be reduced or prevented. As a result, it is possible to reduce or prevent decreases in the filter characteristics in the acoustic wave devices.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
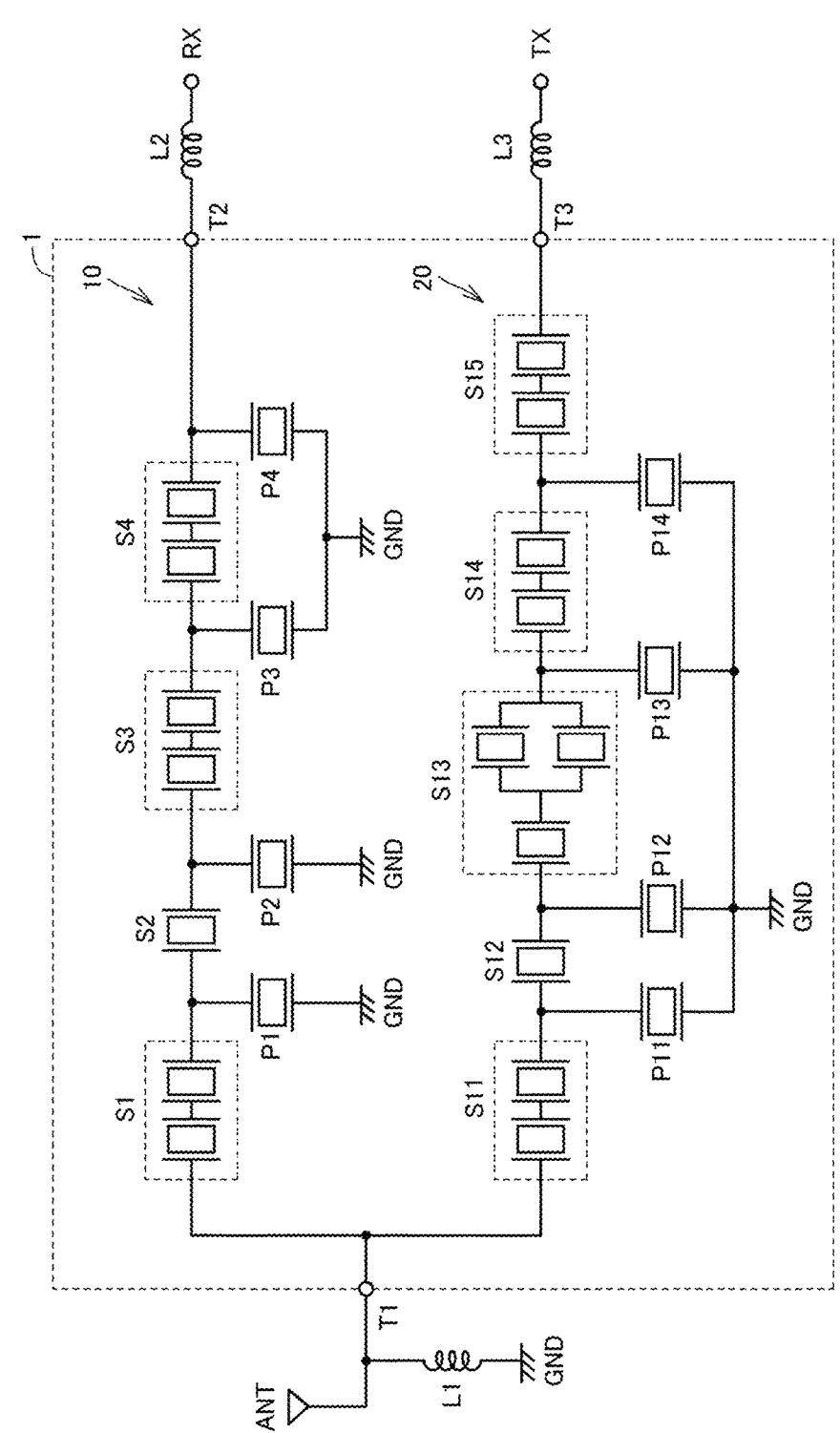
FIG. 1 is a diagram illustrating an example of a circuit configuration of an acoustic wave device according to Example Embodiment 1 of the present invention.

Hereinafter, example embodiments of the present disclosure will be described in detail with reference to the accompanying drawings. The same or corresponding portions in the drawings are denoted by the same reference numerals, and the description is not repeated.

Example Embodiment 1

Configuration of Acoustic Wave Device

FIG. 1 is a diagram illustrating a circuit configuration of an acoustic wave device 1 according to Example Embodiment 1. The acoustic wave device 1 is, for example, a filter device used in a transmission and reception circuit of a communication device.

With reference to FIG. 1, the acoustic wave device 1 includes an antenna terminal T1 connected to an antenna ANT, and a reception (RX) filter 10 and a transmission (TX) filter 20 electrically connected to the antenna terminal T1. The example of the acoustic wave device 1 illustrated in FIG. 1 is a so-called duplexer including two filters.

The reception filter 10 is a ladder filter connected between the antenna terminal T1 and the reception terminal T2, and filters a signal received by the antenna ANT to output the filtered signal from the reception terminal T2. The filter 10 is configured to pass the signal in a first pass band. An inductor L1 for impedance matching is connected between the antenna terminal T1 and a ground potential GND. In addition, the reception terminal T2 is connected to a reception circuit (not illustrated) with an inductor L2 for impedance matching interposed therebetween.

The filter 10 includes a series arm circuit including series arm resonant portions S1 to S4 connected in series between the antenna terminal T1 and the reception terminal T2, and a parallel arm circuit including parallel arm resonant portions P1 to P4 connected between the series arm circuit and the ground potential GND. Each resonant portion of the series arm resonant portions S1 to S4 and the parallel arm resonant portions P1 to P4 includes at least one acoustic wave resonator. In the example of FIG. 1, each resonant portion of the series arm resonant portion S2 and the parallel arm resonant portions P1 to P4 includes one acoustic wave resonator, and each resonant portion of the resonant portions of the series arm resonant portions S1, S3, and S4 includes two acoustic wave resonators. However, the number of acoustic wave resonators included in each resonant portion is not limited thereto, and is appropriately selected according to the characteristics of the filter. As the acoustic wave resonator, for example, a surface acoustic wave (SAW) resonator, a bulk acoustic wave (BAW) resonator, or the like can be used. As the BAW resonator, a film bulk acoustic resonator (FBAR) and/or a solid mounted resonator (SMR) can be used.

One end of the parallel arm resonant portion P1 is connected to a connection point between the series arm resonant portion S1 and the series arm resonant portion S2, and the other end is connected to the ground potential GND. One end of the parallel arm resonant portion P2 is connected to a connection point between the series arm resonant portion S2 and the series arm resonant portion S3, and the other end is connected to the ground potential GND. One end of the parallel arm resonant portion P3 is connected to a connection point between the series arm resonant portion S3 and the series arm resonant portion S4, and the other end is connected to the ground potential GND. One end of the parallel arm resonant portion P4 is connected to the reception terminal T2, and the other end is connected to the ground potential GND together with the other end of the parallel arm resonant portion P3.

The transmission filter 20 is a ladder filter connected between the antenna terminal T1 and the transmission terminal T3, and filters a signal received by the transmission terminal T3 to output the filtered signal from the antenna ANT. The filter 20 is configured to pass the signal in the second pass band. The pass band of the filter 20 is different from the pass band of the filter 10. The transmission terminal T3 is connected to a transmission circuit (not illustrated) with an inductor L3 for impedance matching interposed therebetween.

The reception filter 20 includes a series arm circuit including series arm resonant portions S11 to S15 connected in series between the antenna terminal T1 and the transmission terminal T3, and a parallel arm circuit including parallel arm resonant portions P11 to P14 connected between the series arm circuit and the ground potential GND. Each resonant portion of the series arm resonant portions S11 to S15 and the parallel arm resonant portions P11 and P14 includes at least one acoustic wave resonator. In the filter 20, similar to the filter 10, the number of acoustic wave resonators included in each resonant portion is not limited to the case of FIG. 1, and is appropriately selected according to the characteristics of the filter. In addition, for the acoustic wave resonator to be used, an SAW resonator, a BAW resonator, or the like can be used.

One end of the parallel arm resonant portion P11 is connected to a connection point between the series arm resonant portion S11 and the series arm resonant portion S12, and the other end is connected to the ground potential GND. One end of the parallel arm resonant portion P12 is connected to a connection point between the series arm resonant portion S12 and the series arm resonant portion S13, and the other end is connected to the ground potential GND together with the other end of the parallel arm resonant portion P11. One end of the parallel arm resonant portion P13 is connected to a connection point between the series arm resonant portion S13 and the series arm resonant portion S14, and the other end is connected to the ground potential GND together with the other end of the parallel arm resonant portion P11. One end of the parallel arm resonant portion P14 is connected to a connection point between the series arm resonant portion S14 and the series arm resonant portion S15, and the other end is connected to the ground potential GND together with the other end of the parallel arm resonant portion P11.

The filter 10 corresponds to the "first filter", and the filter 20 corresponds to the "second filter".

Figure 2:
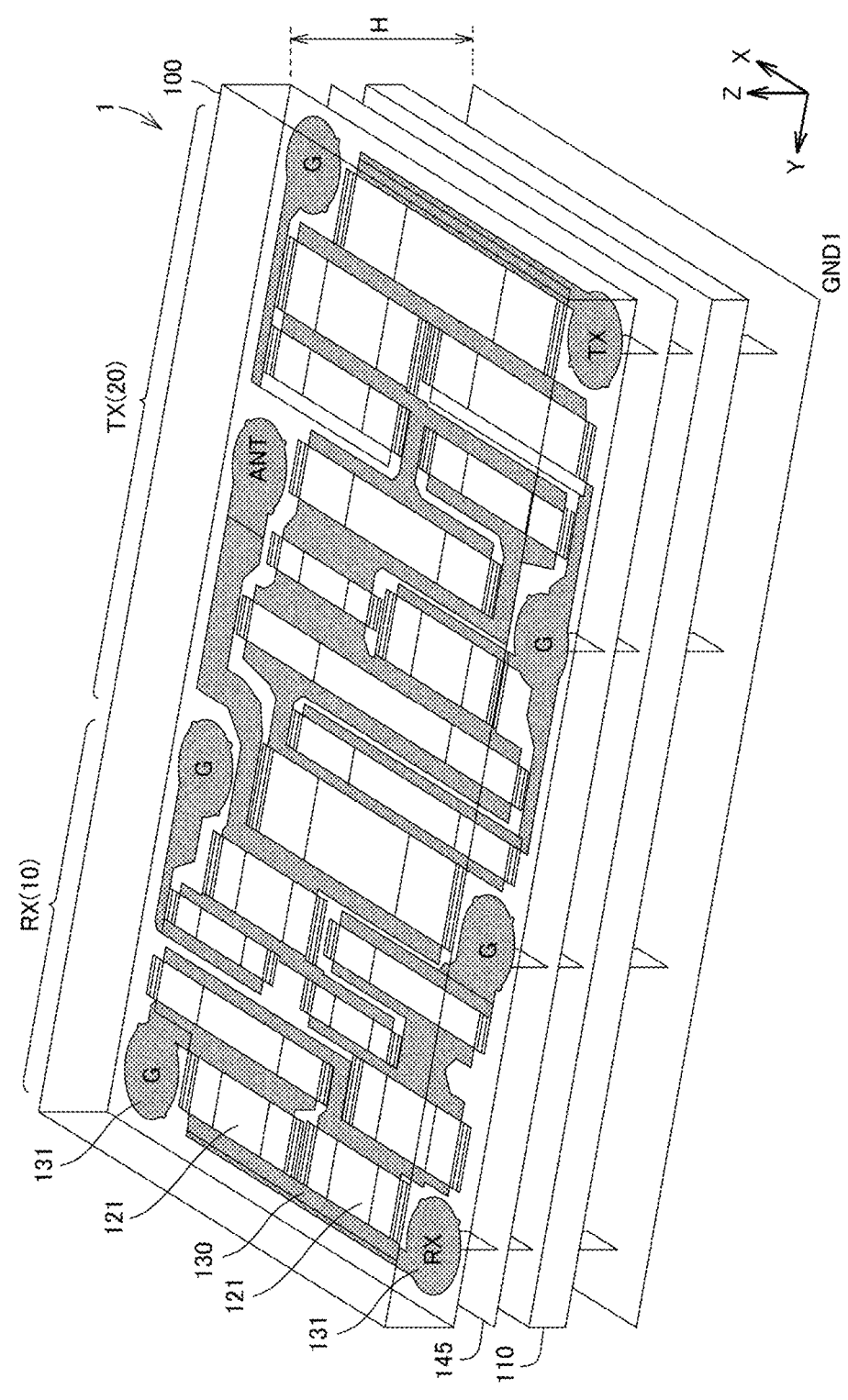
FIG. 2 is a schematic perspective view of the acoustic wave device according to Example Embodiment 1 of the present invention.
Figure 3:
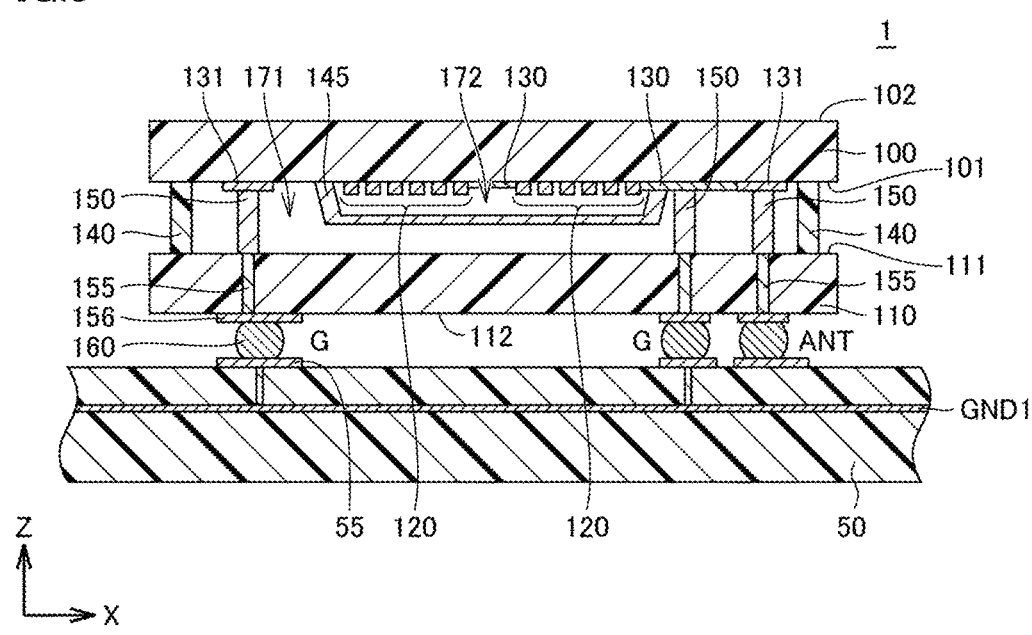
FIG. 3 is a cross-sectional view of the acoustic wave device according to Example Embodiment 1 of the present invention.

Next, a structure of the acoustic wave device 1 will be described with reference to FIGS. 2 and 3. FIG. 2 is a schematic perspective view of the acoustic wave device 1 of FIG. 1, and FIG. 3 is a cross-sectional view of the acoustic wave device 1. In the cross-sectional view of FIG. 3, a configuration of a portion of the filter 10 is illustrated for ease of description. Although not illustrated in FIG. 3, a configuration of the portion of the filter 20 is also basically the same as the configuration of the filter 10.

With reference to FIGS. 2 and 3, the acoustic wave device 1 has a so-called one-chip type structure in which the filter 10 and the filter 20 in FIG. 1 are disposed on the main surface of the same substrate. In the following description, a direction of a normal line (thickness direction) of the main surface of the piezoelectric substrate 100 is defined as a Z axis direction, and a direction in a plane of the piezoelectric substrate 100 is defined as an X axis direction and a Y axis direction. In addition, a positive direction of the Z axis may be referred to as "upward", and a negative direction may be referred to as "downward".

The acoustic wave device 1 includes the piezoelectric substrate 100 and the resonator 120 defining a filter, a cover 110, a support layer 140, a shield layer 145, a columnar electrode 150, a connection electrode 155, an outer terminal electrode 156, and a solder bump 160.

As illustrated in FIG. 2, a plurality of the resonators 120 and a plurality of the electrode pads 131 connected to the outer terminal electrodes 156 are disposed on the piezoelectric substrate 100, and the resonators 120 are connected to each other and/or the resonator 120 and the electrode pad 131 are connected by the wiring electrode 130. In general, in FIG. 2, the reception filter 10 is disposed in the positive direction of the Y axis of the piezoelectric substrate 100, and the transmission filter 20 is disposed in the negative direction of the Y axis.

The piezoelectric substrate 100 is made of, for example, a piezoelectric single crystal material such as lithium tantalate ($LiTaO_3$), lithium niobate ($LiNbO_3$), zinc oxide (ZnO), aluminum nitride, or lead zirconate titanate (PZT), or a piezoelectric laminate material thereof.

The resonator 120 of the filter 10 is disposed on the bottom surface 101 of the piezoelectric substrate 100. In FIG. 3, for convenience, the example is described in which two resonators 120 are disposed on the piezoelectric substrate 100, but the number of resonators is not limited thereto.

Figure 4:
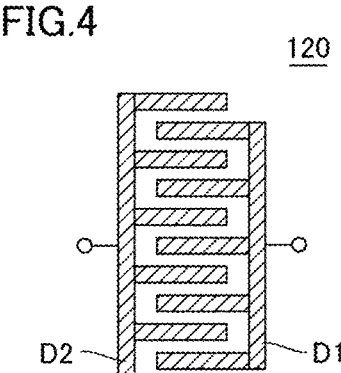
FIG. 4 is a diagram for describing a schematic configuration of an interdigital transducer (IDT) electrode.

The resonator 120 includes an acoustic wave resonator including an interdigital transducer (IDT) electrode having two facing comb-shaped electrodes D1 and D2, as illustrated in FIG. 4. The SAW resonator includes the piezoelectric substrate 100 and the resonator 120.

The resonator 120 can be made of a metal material such as a single metal including at least one of aluminum (Al), copper (Cu), silver (Ag), gold (Au), titanium (Ti), tungsten (W), platinum (Pt), chromium (Cr), nickel (Ni), or molybdenum (Mo), or an alloy in which these metals are used as a main component. In addition, the resonator 120 may have a structure in which a plurality of metal films made of these metals or alloys are laminated.

The cover 110 is supported by the support layer 140 at a position spaced apart from the piezoelectric substrate 100. The support layer 140 is disposed to surround the periphery of the resonator 120 on the piezoelectric substrate 100. The piezoelectric substrate 100, the cover 110, and the support layer 140 form a hollow space 171 between the piezoelectric substrate 100 and the cover 110. The cover 110 and the support layer 140 are made of, for example, a resin including an organic material such as polyimide, an epoxy-based resin, a cyclic olefin-based resin, benzocyclobutene, polybenzoxazole, a phenol-based resin, silicone, or an acrylic resin, or a conductive material such as copper, silver, aluminum, nickel, or an alloy of these materials.

The columnar electrode 150 defining a portion of a signal path between the resonator 120 and the outer device is disposed in the hollow space 171. The columnar electrode 150 is made of a conductive material such as copper, silver, aluminum, nickel, or an alloy of these materials. The columnar electrode 150 extends between the electrode pad 131 disposed on the bottom surface 101 of the piezoelectric substrate 100 and a top surface 111 of the cover 110. On the bottom surface 101 of the piezoelectric substrate 100, the resonators 120 are electrically connected to each other, and the resonator 120 and the electrode pad 131 are electrically connected by the wiring electrode 130.

The columnar electrode 150 is connected to the outer terminal electrode 156 disposed on the bottom surface 112 of the cover 110 with the connection electrode 155 penetrating the cover 110 interposed therebetween. The outer terminal electrode 156 includes an antenna terminal T1, a reception terminal T2, a transmission terminal T3, and a ground terminal G. The outer terminal electrode 156 is connected to the mounting terminal 55 on the mounting substrate 50 with a solder bump 160 interposed therebetween. A ground electrode GND1 serving as a reference potential is disposed on the mounting substrate 50, and the ground terminal G of the acoustic wave device 1 is connected to the ground electrode GND1. In a case where the support layer 140 is made of a conductive material, the columnar electrode 150 and the conductive material of the support layer 140 may be made of the same material.

In addition, in the acoustic wave device 1 of Example Embodiment 1, the shield layer 145 is disposed in the hollow space 171 between the resonator 120 and the top surface 111 of the cover 110 close to the resonator 120. The shield layer 145 is made of, for example, a conductive material such as copper, silver, or aluminum.

One electrode D2 of the resonator 120 of the parallel arm resonator is connected to the shield layer 145. In addition, the shield layer 145 is connected to the ground terminal G with the columnar electrode 150 interposed therebetween. In other words, the electrode D2 of the resonator 120 of the parallel arm is connected to the ground terminal G with the shield layer 145 interposed therebetween. With such a configuration, for example, a signal from the antenna ANT to the ground potential GND passes through the parallel arm resonator, and is connected to the ground potential GND through the shield layer 145, the columnar electrode 150, and the ground terminal G.

Filter Characteristics

Figure 5:
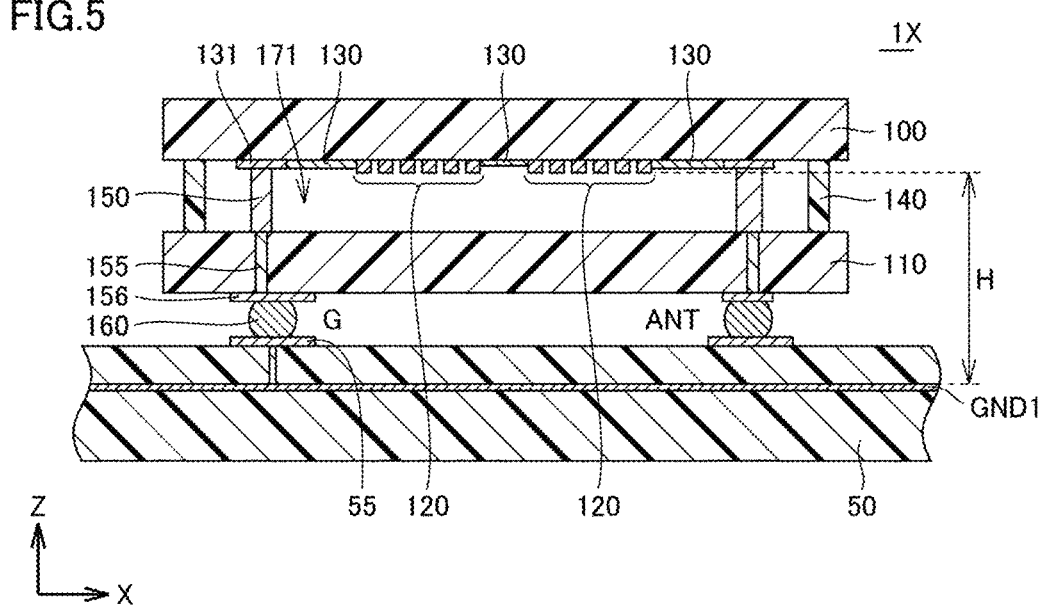
FIG. 5 is a cross-sectional view of an acoustic wave device of a comparative example.

FIG. 5 is a cross-sectional view of the acoustic wave device 1X of the comparative example. In the acoustic wave device 1X, the shield layer 145 is not disposed, unlike the acoustic wave device 1. Therefore, in the acoustic wave device 1X, one electrode D2 of the resonator 120 of the parallel arm resonator is connected to the columnar electrode 150 by the wiring electrode 130 on the piezoelectric substrate 100.

Figures 6A, 6B:
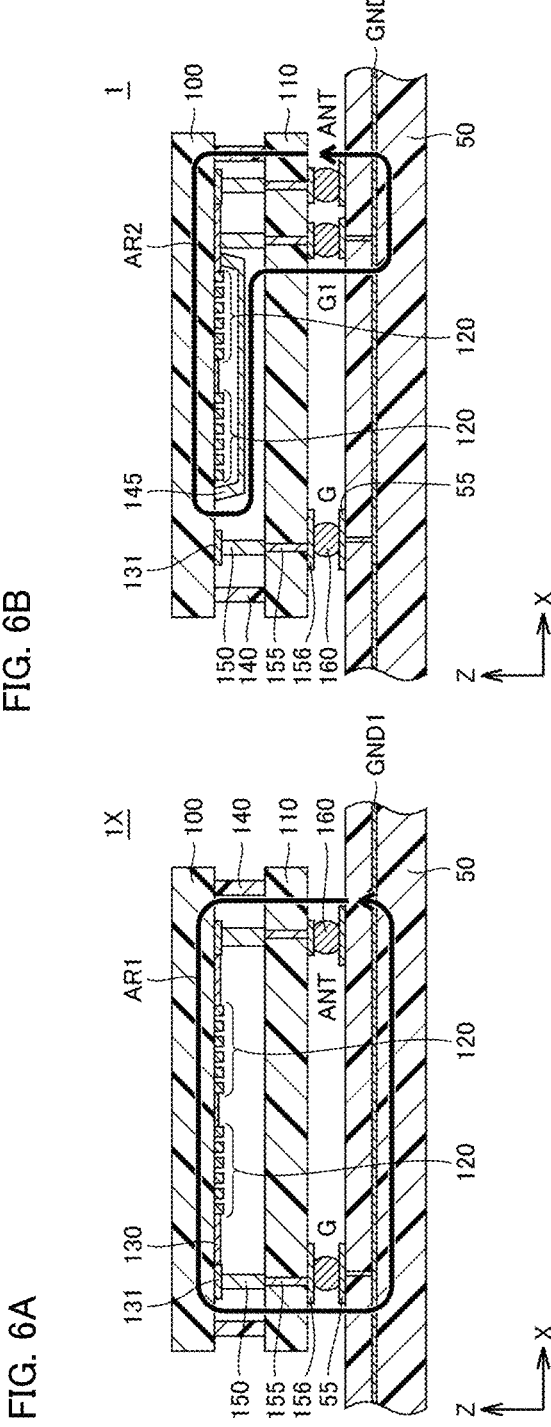
FIGS. 6A and 6B are diagrams for describing a passage path of a signal passing through a filter in the acoustic wave devices of the comparative example and Example Embodiment 1 of the present invention.

FIGS. 6A and 6B are diagrams for describing a passage path of a signal passing through a filter in the acoustic wave device 1X of the comparative example (FIG. 6A) and the acoustic wave device 1 of Example Embodiment 1 (FIG. 6B). In the acoustic wave device 1X of the comparative example, a portion of the high-frequency signal received by the antenna ANT is transmitted to the resonator 120 by the columnar electrode 150 and the wiring electrode 130, passes through the plurality of resonators 120, and then is transmitted to the ground electrode GND1 of the mounting substrate 50 through the wiring electrode 130 and the columnar electrode 150 on the other side of the piezoelectric substrate 100. That is, the signal from the antenna ANT to the ground electrode GND1 is transmitted in a loop shape as indicated by the arrow AR1.

On the other hand, in the acoustic wave device 1 of Example Embodiment 1, the signal passing through the resonator 120 passes through the shield layer 145, and is transmitted to the ground electrode GND1 of the mounting substrate 50 with the columnar electrode 150 provided close to the outer terminal electrode connected to the antenna ANT interposed therebetween. That is, the signal from the antenna ANT to the ground electrode GND1 is transmitted in a loop shape as indicated by the arrow AR2.

In general, when a signal (that is, a current) passes through such a loop-shaped path, a magnetic field is generated by the current passing through the loop. In the configurations such as the acoustic wave device 1 and the acoustic wave device 1X, since a plurality of parallel arm resonators are present in each filter, a plurality of paths leading to the ground potential GND can be generated through the resonator. In this case, the induction coupling between the magnetic fields generated between the adjacent loops occurs inside the filter and between the filters. When the induction coupling is increased, the attenuation characteristics in the filter may be decreased, or the isolation characteristics between the filters may be decreased.

Here, the magnitude of the generated magnetic field increases as the opening area of the loop increases. In addition, when the opening area of the loop is increased, the magnetic field generated in the other loop is likely to be received, and thus the induction coupling is likely to occur.

In the acoustic wave device 1 of Example Embodiment 1, as illustrated in FIGS. 6A and 6B, since the signal passes through the shield layer 145 covering the resonator 120, the opening area of the loop (arrow AR2) drawn by the signal path is smaller than the opening area of the loop (arrow AR1) drawn by the signal path of the acoustic wave device 1× of the comparative example. As a result, in the case of the acoustic wave device 1 of Example Embodiment 1, the generated magnetic field is smaller than that in the acoustic wave device 1× of the comparative example, and the dielectric coupling with the adjacent loop is unlikely to occur. Therefore, by adopting a configuration such as the acoustic wave device 1 according to Example Embodiment 1, it is possible to reduce or prevent the influence of the induction coupling between the loops on the filter characteristics.

Figure 7:
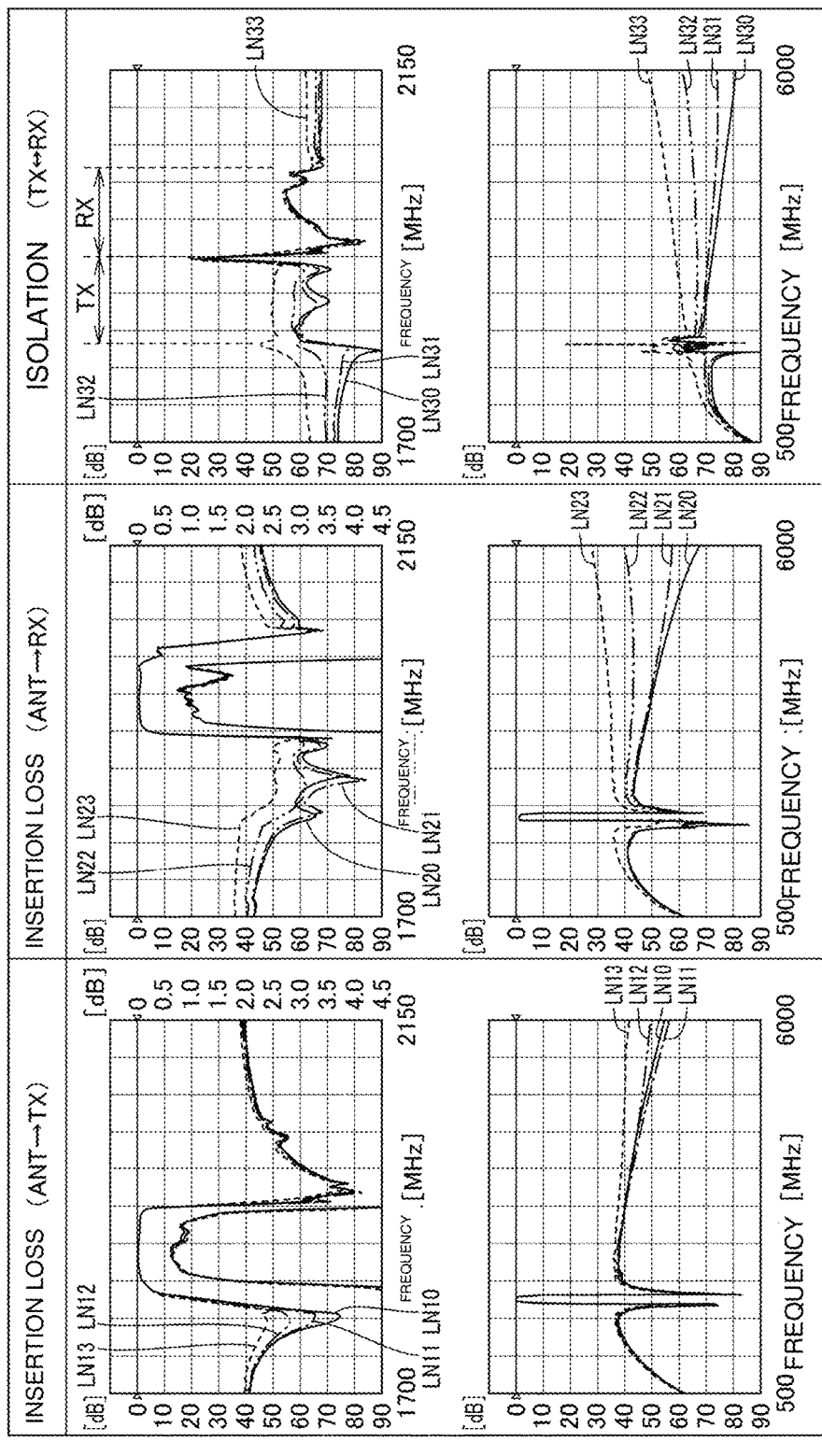
FIG. 7 is a diagram illustrating filter characteristics when a distance between an outer ground electrode and a resonator is changed in the acoustic wave device of the comparative example.

FIG. 7 is a diagram illustrating filter characteristics when the distance H (FIG. 5) between the outer ground electrode GND1 and the resonator 120 is changed in the acoustic wave device 1X of the comparative example. In FIG. 7, the left column illustrates the insertion loss of the filter 20 on the transmission side, and the middle column illustrates the insertion loss of the filter 10 on the reception side. In addition, the right column of FIG. 7 illustrates the isolation characteristics between the filter 10 and the filter 20. In FIG. 7, characteristics for frequencies between about 0.5 GHz to about 6.0 GHz are illustrated in the lower stage, and characteristics for frequencies between about 1.7 GHZ to about 2.15 GHz are illustrated in the upper stage, for example. Furthermore, in the upper graph of the insertion loss, a waveform with the vertical axis enlarged is also drawn.

With reference to FIG. 7, in each graph, the solid lines LN10, LN20, and LN30 indicate a case where the distance H is 20 μm, and the one-dot chain lines LN11, LN21, and LN31 indicate a case where the distance H is about 40 μm, for example. In addition, the two-dot chain lines LN12, LN22, and LN32 indicate a case where the distance H is about 80 μm, and the one-dot chain lines LN13, LN23, and LN33 indicate a case where the distance H is about 160 μm, for example.

Regarding the insertion loss of the left column and the middle column, there is almost no difference in loss due to the distance H between the ground electrode GND1 and the resonator 120 in the target pass band. However, in the non-pass band, the attenuation is decreased as the distance H is increased (that is, as the opening area of the loop is increased).

In addition, regarding the isolation characteristics between the filters in the right column, although there is no significant change in the pass band on the reception side, the isolation is decreased in the pass band on the transmission side, the non-pass band lower than the pass band on the transmission side, and the non-pass band higher than the pass band on the reception side.

As described above, in the acoustic wave device 1X of the comparative example, when the opening area of the loop of the signal path is increased, the attenuation characteristics in the non-pass band and the isolation characteristics between the filters are decreased.

Figure 8:
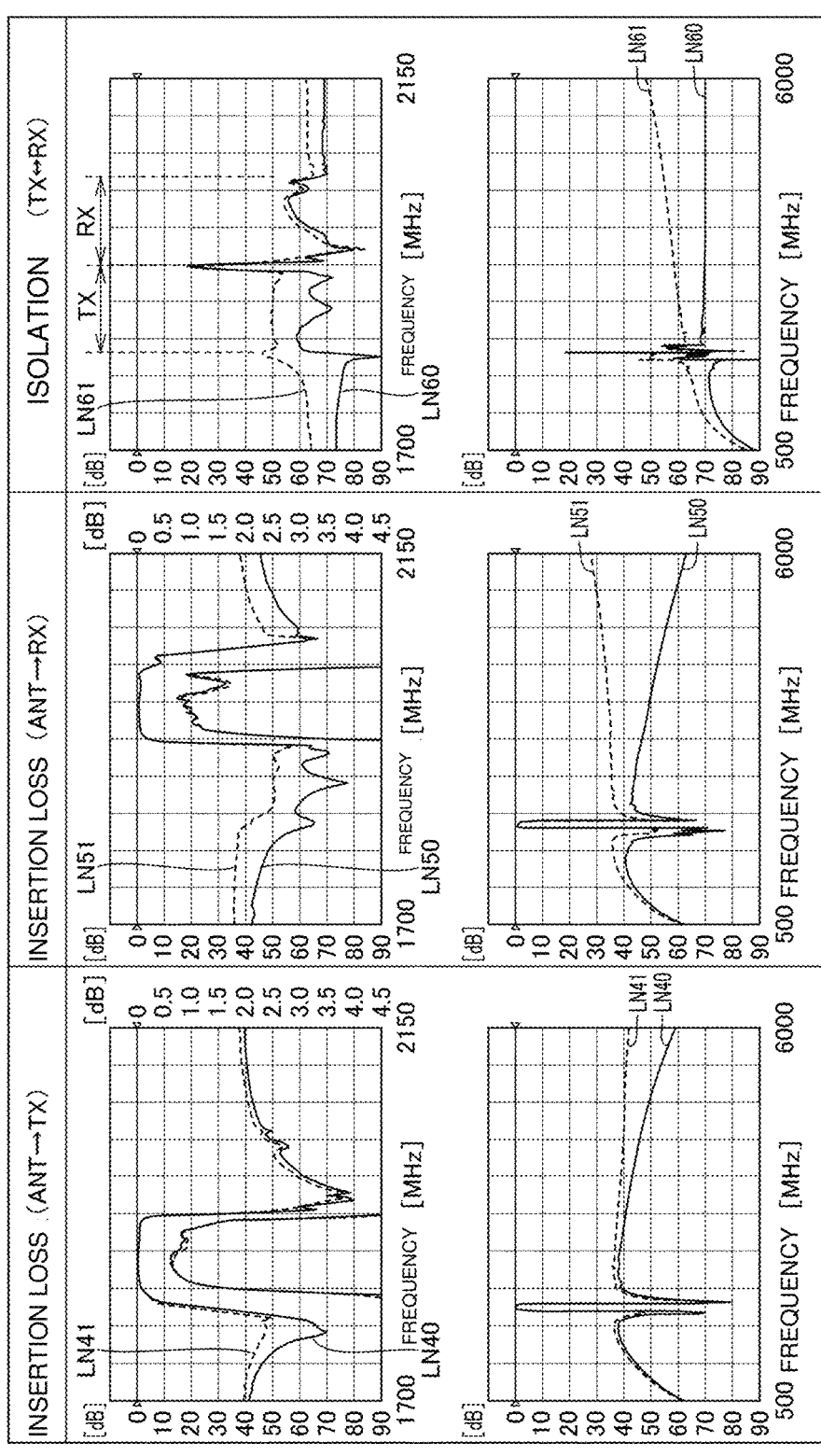
FIG. 8 is a diagram illustrating filter characteristics in the acoustic wave device of Example Embodiment 1 of the present invention.

FIG. 8 is a diagram illustrating filter characteristics in the acoustic wave device 1 according to Example Embodiment 1. In FIG. 8 as well, the left column illustrates the insertion loss of the filter 20 on the transmission side, the middle column illustrates the insertion loss of the filter 10 on the reception side, and the right illustrates column the isolation characteristics between the filter 10 and the filter 20. In addition, in FIG. 8, the characteristics of the acoustic wave device 1 (solid lines LN40, LN50, and LN60) in a case where the distance H between the outer ground electrode GND1 and the resonator 120 is set to 160 μm and the characteristics of the acoustic wave device 1× of the comparative example (broken lines LN41, LN51, and LN61) are illustrated.

As illustrated in FIG. 8, in the case of the acoustic wave device 1 of Example Embodiment 1, even in a case where the distance H between the ground electrode GND1 and the resonator 120 is long, the decrease in the attenuation characteristics and the isolation characteristics in the non-pass band is reduced or prevented, and the same characteristics as in a case where the distance H of FIG. 7 is 20 μm can be achieved.

As described above, the shield layer 145 is disposed to be close to and to cover the resonator 120 as in the acoustic wave device 1 according to Example Embodiment 1, and the resonator 120 and the ground electrode GND1 are connected to each other with the shield layer 145 interposed therebetween. Therefore, the opening area of the loop defined by the signal path can be reduced, and the induction coupling between the adjacent loops in the filter and/or between the filters can be weakened. As a result, it is possible to reduce or prevent a decrease in filter characteristics such as attenuation characteristics in a non-pass band and isolation characteristics between the filters.

Influence of Distance Between Shield Layer and IDT Electrode

As described above, by disposing the shield layer connected to the resonator, it is possible to reduce or prevent a decrease in the filter characteristics. However, there may be cases where the desired improvement in characteristics cannot necessarily be achieved depending on the disposition mode of the shield layer. Next, with reference to FIGS. 9 and 10, the influence of the distance between the resonator 120 and the shield layer 145 on the filter characteristics will be described.

Figure 9:
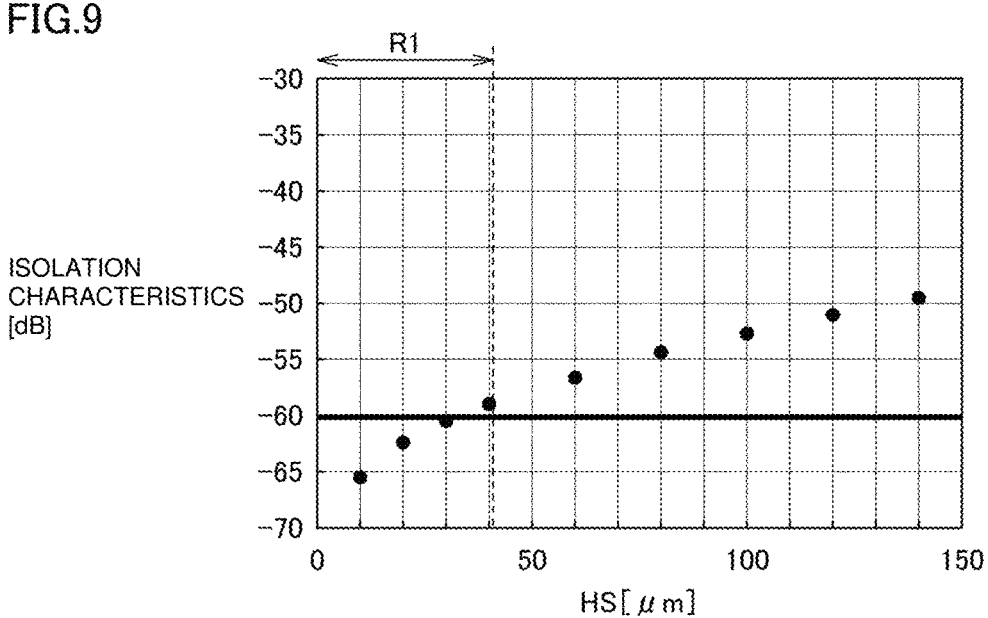
FIG. 9 is a diagram illustrating isolation characteristics when a distance between an IDT electrode and a shield layer is changed.

FIG. 9 is a diagram for describing an influence on the isolation characteristics when the distance HS between the resonator 120 (IDT electrode) and the shield layer 145 is changed. In FIG. 9, the distance HS between the resonator 120 and the shield layer 145 is illustrated on the horizontal axis, and the simulation result of the isolation characteristics between the filters in the pass band of the filter 20 on the transmission side is illustrated on the vertical axis.

As illustrated in FIG. 9, as the distance HS between the resonator 120 and the shield layer 145 increases, the isolation characteristics decrease. This is considered to be because the loop area of the portion passing through the shield layer 145 from the resonator 120 increases as the distance HS increases, and thus the induction coupling between the adjacent loops of the filters increases. From the simulation result of FIG. 9, it is understood that it is preferable that the distance HS between the resonator 120 and the shield layer 145 is set to about 40 μm or less (region R1) in order to ensure the isolation of about 60 dB or more, for example.

On the other hand, when the distance HS between the resonator 120 and the shield layer 145 is made too small, the influence of the capacitive coupling between the resonator 120 and the shield layer 145 cannot be ignored, and there is a possibility that the filter characteristics may decrease due to the influence of the change in the resonant frequency and/or the change in the impedance due to the capacitive coupling.

Figure 10:
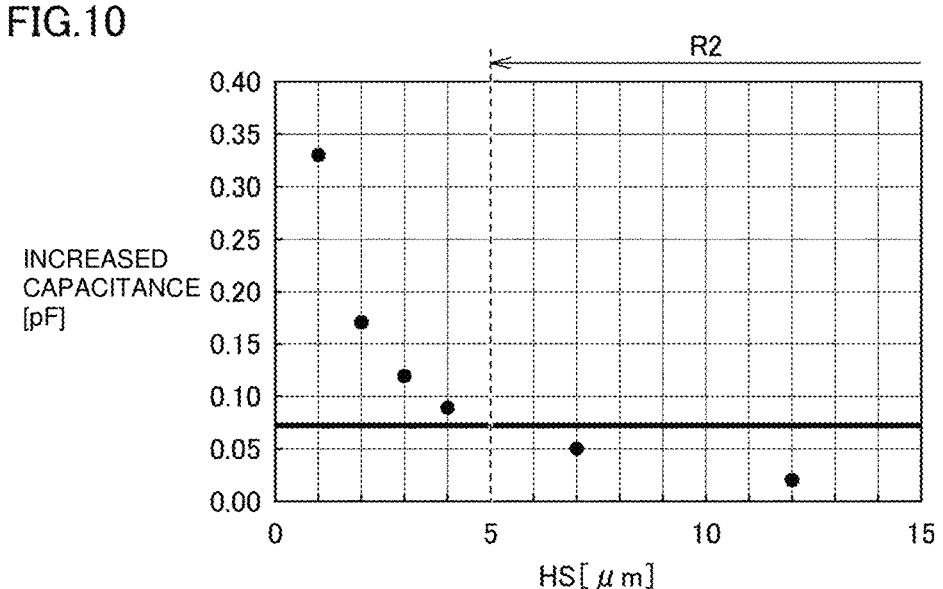
FIG. 10 is a diagram illustrating an increase in capacitive coupling between the resonator and the shield layer when the distance between the IDT electrode and the shield layer is changed.

FIG. 10 is a diagram illustrating a result of performing a simulation on a change in the capacitive coupling between the resonator 120 and the shield layer 145 when the distance HS between the resonator 120 and the shield layer 145 is changed. In FIG. 10, the distance HS between the resonator 120 and the shield layer 145 is illustrated on the horizontal axis, and the increased capacitance between the resonator 120 and the shield layer 145 is illustrated on the vertical axis.

As illustrated in FIG. 10, it is understood that the capacitive coupling is increased as the distance HS is decreased. In addition, it is understood that it is preferable that the distance HS is about 5 μm or more (region R2) in order to keep the increased capacitance to about 0.075 pF or less, for example.

From the above results, by setting the distance HS between the resonator 120 and the shield layer 145 to about 5 μm or more and about 40 μm or less (about 5 μm≤HS≤about 40 μm), for example, stable filter characteristics can be achieved.

The "filter 10" and the "filter 20" in Example Embodiment 1 correspond to the "first filter" and the "second filter", respectively. The "antenna terminal T1", the "reception terminal T2", and the "transmission terminal T3" in Example Embodiment 1 correspond to the "first terminal", the "second terminal", and the "third terminal", respectively. The "piezoelectric substrate 100" in Example Embodiment 1 corresponds to the "first piezoelectric substrate". The "electrode D1" and the "electrode D2" in Example Embodiment 1 correspond to the "first electrode" and the "second electrode", respectively. The "bottom surface 101" and "top surface 102" of the piezoelectric substrate 100 and the "top surface 111" and "bottom surface 112" of the cover 110 in Example Embodiment 1 correspond to the "first surface" to "fourth surface", respectively.

Example Embodiment 2

The acoustic wave device of Example Embodiment 1 is described as a case of a one-chip type filter device in which two filters are disposed on the same piezoelectric substrate.

In Example Embodiment 2, a case where the acoustic wave device is a stack-type filter device in which two filters configured on piezoelectric substrates different from each other are stacked will be described.

Figure 11:
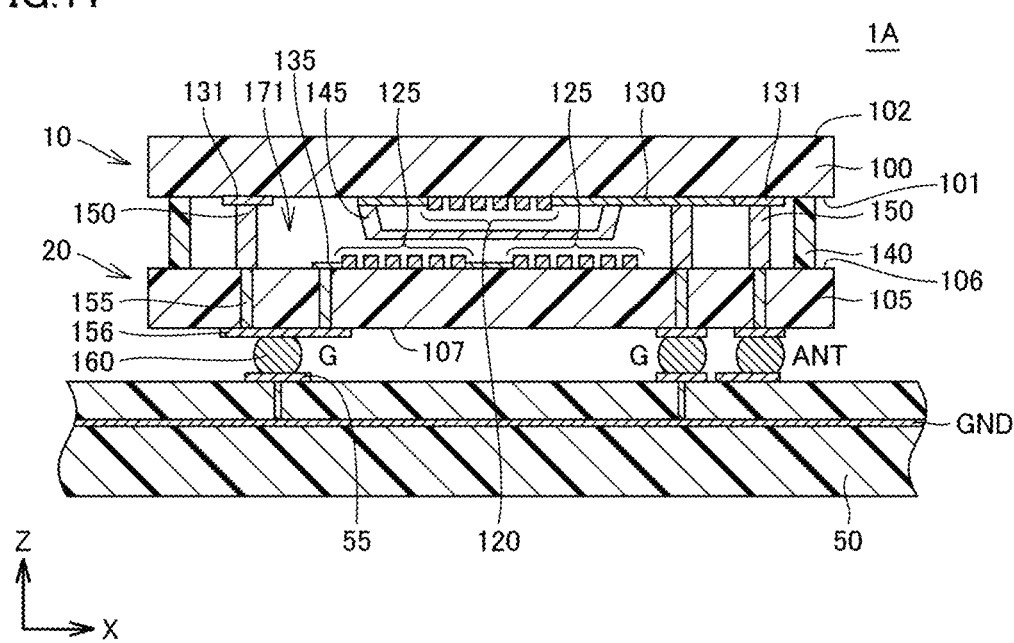
FIG. 11 is a cross-sectional view of an acoustic wave device according to Example Embodiment 2 of the present invention.

FIG. 11 is a cross-sectional view of an acoustic wave device 1A according to Example Embodiment 2. In the acoustic wave device 1A, the filter 10 and the filter 20 in FIG. 1 are formed on different piezoelectric substrates.

Specifically, the filter 10 has a configuration in which the resonator 120 is disposed on the bottom surface 101 of the piezoelectric substrate 100, similar to the case of Example Embodiment 1. On the other hand, the filter 20 has a configuration in which the resonator 125 is disposed on a top surface 106 of a piezoelectric substrate 105. The piezoelectric substrate 100 and the piezoelectric substrate 105 are disposed to be spaced apart from each other in the Z axis direction by the support layer 140, and a hollow space 171 is formed by the piezoelectric substrate 100, the piezoelectric substrate 105, and the support layer 140. The resonator 120 and the resonator 125 are disposed to face each other in the hollow space 171.

The resonator 120 of the filter 10 is connected to the outer terminal electrode 156 with the columnar electrode 150 disposed inside the hollow space 171 and the connection electrode 155 penetrating the piezoelectric substrate 105 interposed therebetween. In addition, the resonator 125 of the filter 20 is connected to the outer terminal electrode 156 with the wiring electrode 135 and the connection electrode 155 interposed therebetween.

The resonator 120 of the filter 10 is covered with the shield layer 145 disposed between the resonator 120 and the resonator 125, similar to the acoustic wave device 1 according to Example Embodiment 1. One terminal of the resonator 120 of the parallel arm resonant portion of the filter 10 is connected to the ground electrode GND1 of the mounting substrate 50 with the shield layer 145 and the ground terminal G interposed therebetween.

The shield layer 145 can reduce or prevent the capacitive coupling between the resonator 120 and the resonator 125 disposed to face each other. In addition, as described in Example Embodiment 1, by connecting the resonator 120 to the ground electrode GND1 with the shield layer 145 disposed close to the resonator 120 interposed therebetween, since the opening area of the loop of the signal path can be reduced, the decrease in the isolation characteristics and the attenuation characteristics can be reduced or prevented.

In a case where the purpose is to reduce or prevent the capacitive coupling between the resonator 120 and the resonator 125, a shield layer that covers the resonator 125 can be disposed on the filter 20 side instead of the shield layer 145. However, in a configuration such as the acoustic wave device 1A, since the filter 10 is disposed at a position farther from the ground electrode GND1 than the filter 20, the opening area of the loop formed in the signal path is also larger in the filter 10. Therefore, in the acoustic wave device 1A, the shield layer 145 is disposed on the filter 10 side. In addition to the shield layer 145, a shield layer covering the resonator 125 may be further disposed in the filter 20. Alternatively, the resonator 125 of the filter 20 may be connected to the ground electrode GND1 with the shield layer 145 interposed therebetween.

Figure 12:
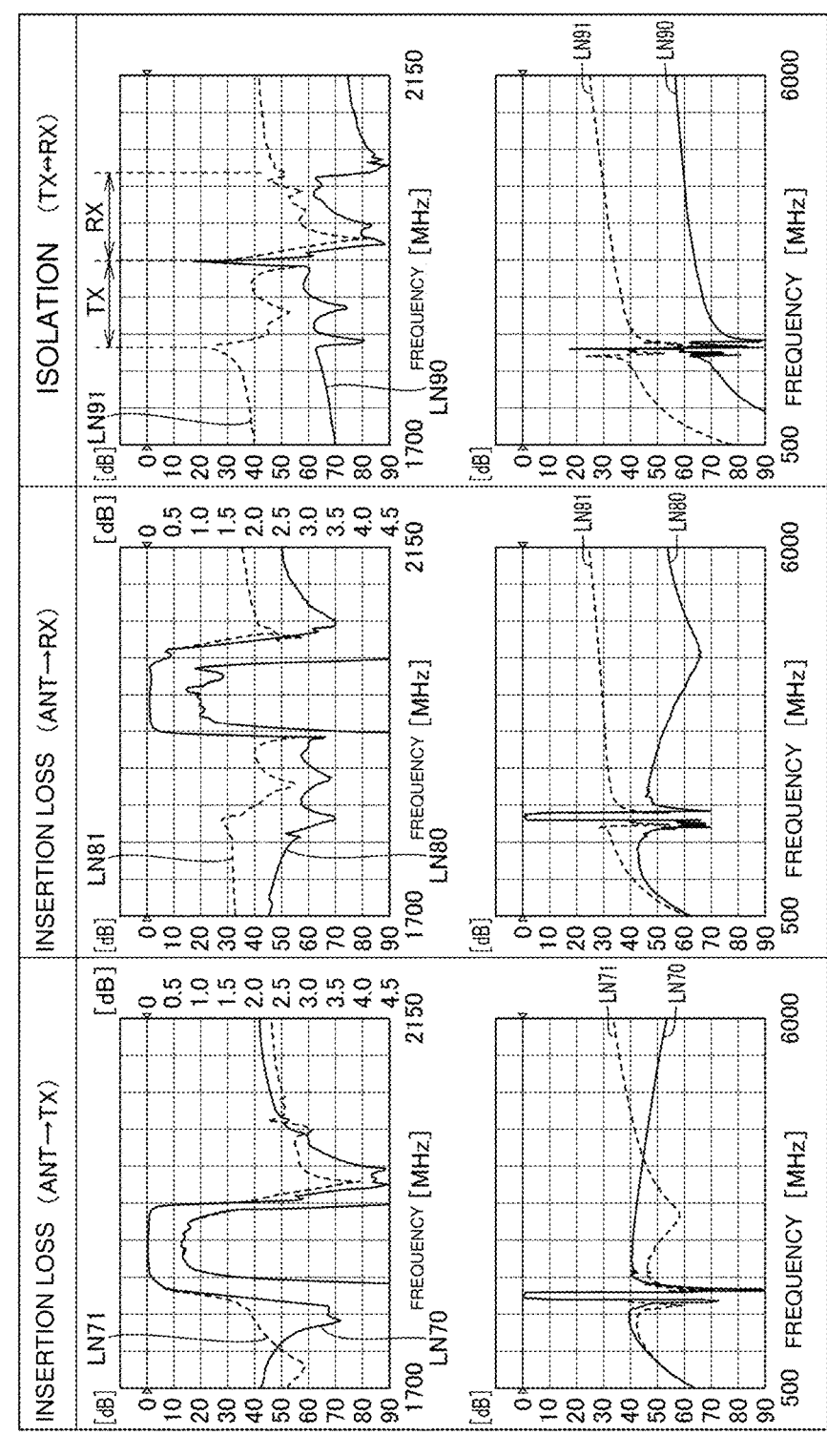
FIG. 12 is a diagram illustrating filter characteristics when a distance between an outer ground electrode and a shield layer is changed in Example Embodiment 2 of the present invention.

FIG. 12 is a diagram illustrating the filter characteristics of the acoustic wave device 1A according to Example Embodiment 2. In FIG. 12 as well, the left column illustrates the insertion loss of the filter 20 on the transmission side, the middle column illustrates the insertion loss of the filter 10 on the reception side, and the right column illustrates the isolation characteristics between the filter 10 and the filter 20. In addition, in FIG. 12, the characteristics (solid lines LN70, LN80, and LN90) of the acoustic wave device 1A and the characteristics (broken lines LN71, LN81, and LN91) of the acoustic wave device of the comparative example in a case where the shield layer is provided but the resonator 120 is not connected to the shield layer are illustrated. In the acoustic wave device 1A of FIG. 12, the resonator 125 of the filter 20 is also connected to the ground electrode GND1 with the shield layer 145 interposed therebetween.

As illustrated in FIG. 12, in any of the filters 10 and 20, in Example Embodiment 2 has better results in the attenuation characteristics in the non-pass band and the isolation characteristics between the filters, as compared with the comparative example.

As described above, in the stack-type acoustic wave device in which the resonator is disposed on each of the two different piezoelectric substrates, by disposing the shield layer covering the resonator and connecting the resonator to the ground potential with the shield layer interposed therebetween, it is possible to reduce or prevent the decrease in the attenuation characteristics of the non-pass band and the isolation characteristics between the filters.

The "filter 10" and the "filter 20" in Example Embodiment 2 correspond to the "first filter" and the "third filter", respectively. The "piezoelectric substrate 100" and the "piezoelectric substrate 105" in Example Embodiment 2 correspond to the "first piezoelectric substrate" and the "second piezoelectric substrate", respectively. The "top surface 106" and the "bottom surface 107" of the piezoelectric substrate 105 in Example Embodiment 2 correspond to the "fifth surface" and the "sixth surface", respectively.

Example Embodiment 3

In Example Embodiment 1, the configuration is described in which the resonator on the piezoelectric substrate is covered with the common shield layer.

In Example Embodiment 3, a configuration will be described in which the shield layer is divided and the signal path to the ground potential for a portion of the resonators is isolated from the signal path for the other resonators.

Figure 13:
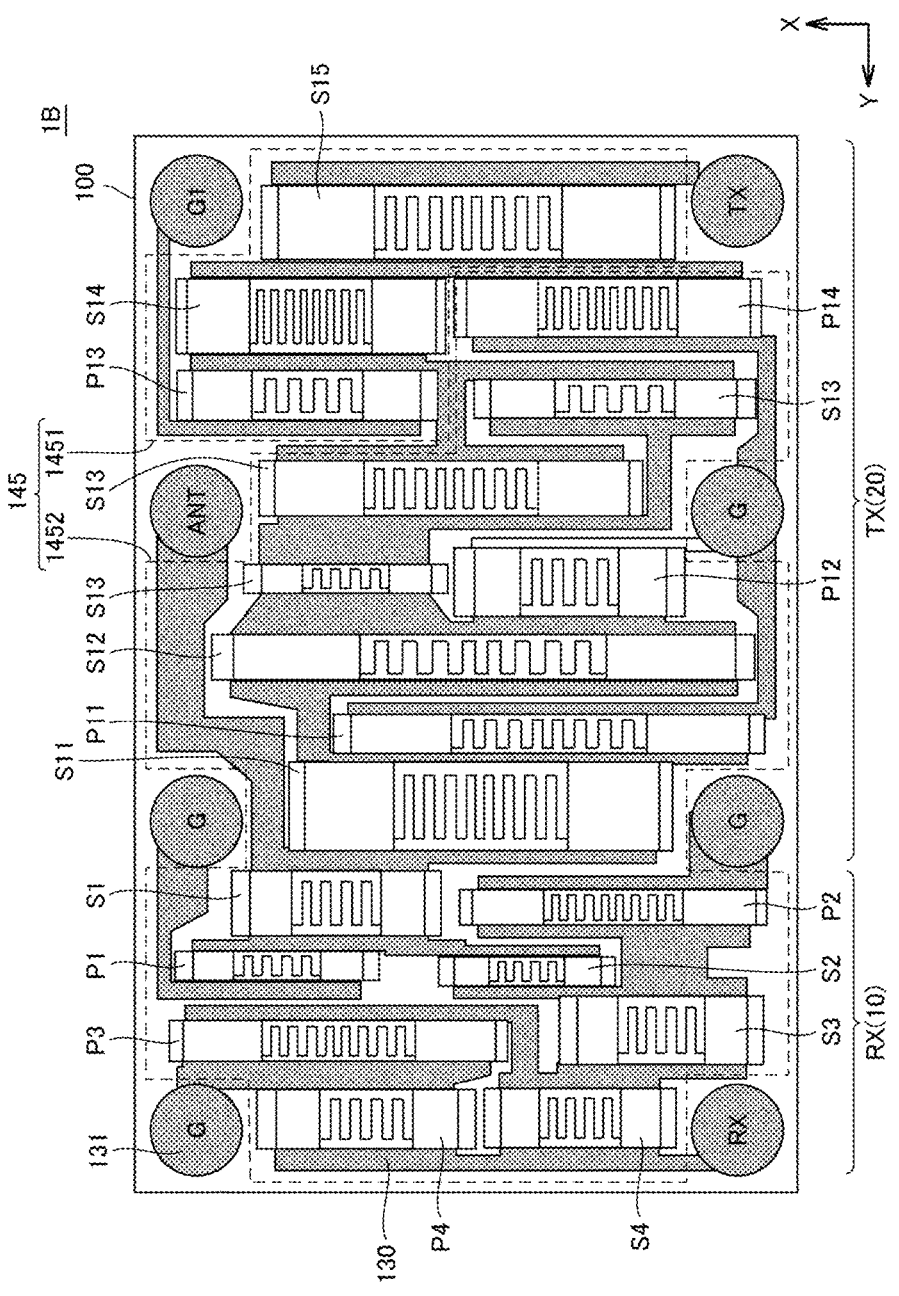
FIG. 13 is a plan view of an acoustic wave device according to Example Embodiment 3 of the present invention.

FIG. 13 is a plan view of an acoustic wave device 1B according to Example Embodiment 3. The acoustic wave device 1B is a one-chip type acoustic wave device in which the filters 10 and 20 are formed by disposing the plurality of resonators 120 on the common piezoelectric substrate 100, similar to the acoustic wave device 1 according to Example Embodiment 1. In the acoustic wave device 1B, the disposition of the resonator 120, the electrode pad 131, and the wiring electrode 130 is the same as that of the acoustic wave device 1 illustrated in FIG. 2.

Figure 14:
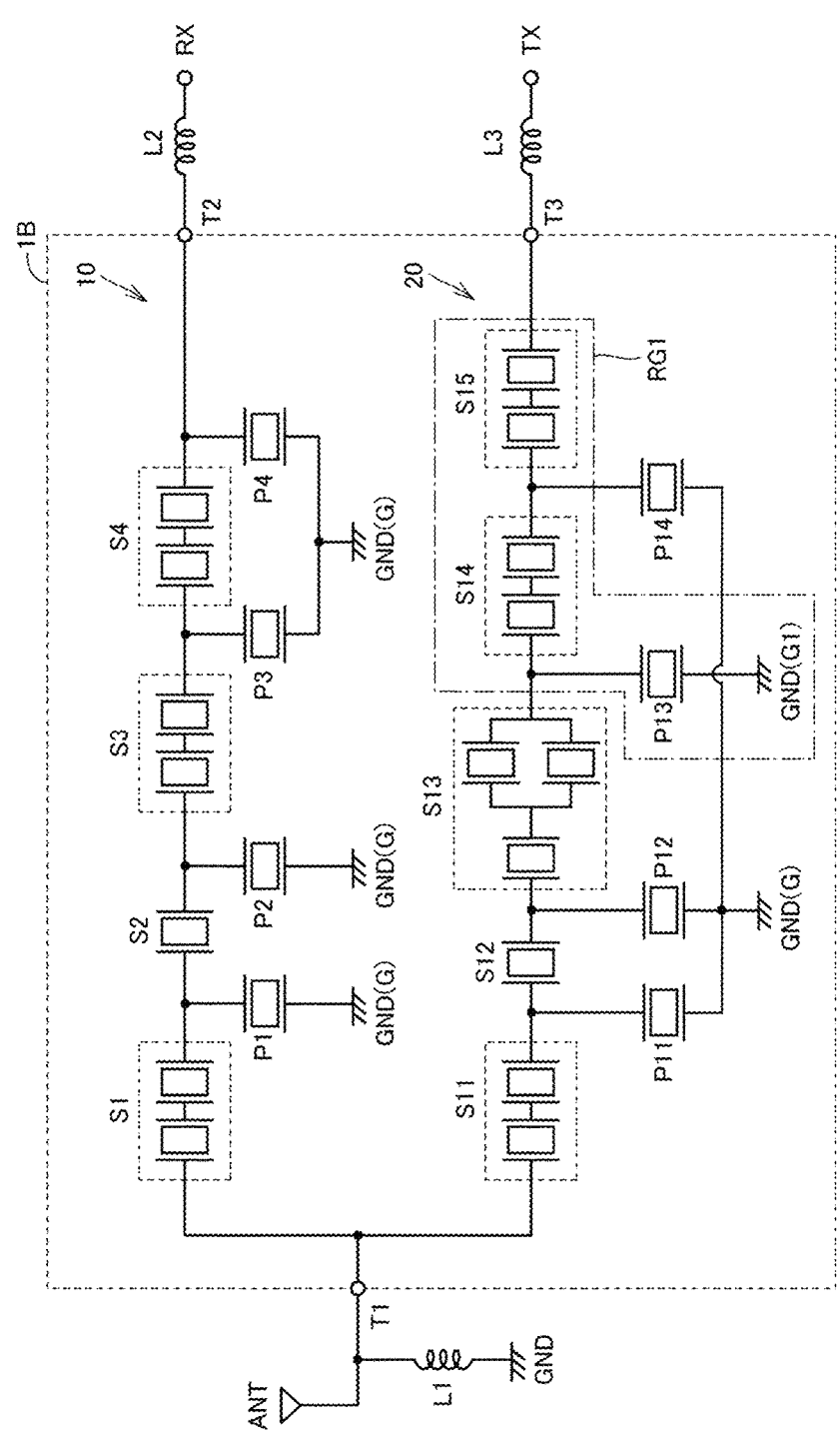
FIG. 14 is a diagram illustrating an example of a circuit configuration of the acoustic wave device of FIG. 13.

On the other hand, in the acoustic wave device 1B, the shield layer 145 covering the resonator 120 is divided into two shield layers 1451 and 1452. The shield layer 1451 is disposed to cover a portion of the signal path from the electrode pad 131 (TX) on the transmission side connected to the transmission terminal T3 to the ground terminal G1 to which the parallel arm resonant portion P14 is connected, that is, the series arm resonant portions S14 and S15 and the parallel arm resonant portion P13 of the region RG1 surrounded by the one-dot chain line in FIG. 14. On the other hand, the shield layer 1452 is disposed to cover the remaining resonators other than the above-described signal path.

In a case where a signal path from a terminal from which a signal is input and output to a ground terminal is relatively short, that is, in a case of a signal path in which an impedance between the terminals is relatively small, there is a tendency that induction coupling is likely to occur in a loop of the signal path. In such a case, since the shield layer connected to the corresponding signal path is made independent, the inductor can be provided between the ground terminal and the parallel arm resonator. A series resonance circuit can be configured by the inductor and the capacitance of the parallel arm resonator, an attenuation pole can be provided on a high-frequency side of a pass band of the filter, and the attenuation characteristics of the filter can be improved.

In particular, in the circuit on the transmission side, since the supplied power is larger than that in the circuit on the reception side, a magnetic field generated in a signal path having a small impedance is stronger, and the induction coupling is likely to occur. Therefore, since the shield layer of the signal path having a short path length from the transmission terminal is made independent, it is possible to effectively reduce or prevent the coupling between the adjacent loops of the signal path.

Instead of or in addition to a portion where the path length from the transmission terminal T3 to the ground electrode GND1 is short, such as the acoustic wave device 1B, the shield layer may be made independent in a portion where the path length from the antenna terminal T1 and/or the reception terminal T2 to the ground electrode GND1 is shortened.

In the above description, the configuration is described in which the shield layer is divided in the one-chip type acoustic wave device, but the configuration can also be applied to a stack-type acoustic wave device as in Example Embodiment 2.

The "shield layer 1451" and the "shield layer 1452" in Example Embodiment 3 correspond to the "first layer" and the "second layer", respectively.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
an outer terminal electrode that includes a first terminal, a second terminal, and a ground terminal;
a first piezoelectric substrate including a first surface and a second surface;
a first filter that is connected to the first terminal and the second terminal and includes a first resonator on the first surface; and
a conductive shield layer above the first resonator to overlap with at least a portion of the first resonator in a case where the first piezoelectric substrate is viewed in a plan view in a thickness direction of the first piezoelectric substrate; wherein
the first resonator includes:
a first electrode electrically connected to the first terminal or the second terminal; and
a second electrode connected to the ground terminal with the conductive shield layer interposed between the second electrode and the ground terminal; and
a distance between the first resonator and the conductive shield layer in the thickness direction of the first piezoelectric substrate is about 5 μm or more and about 40 μm or less.

2. The acoustic wave device according to claim 1, further comprising:
a support; and
a cover that is supported by the support and includes a third surface and a fourth surface; wherein
the cover is spaced apart from the first piezoelectric substrate such that the first surface and the third surface face each other;
the outer terminal electrode is on the fourth surface of the cover; and
the conductive shield layer is between the first surface and the third surface.

3. The acoustic wave device according to claim 2, wherein
the outer terminal electrode further includes a third terminal;
the acoustic wave device further comprises:
a second resonator on the first surface; and
a second filter that is connected to the first terminal and the third terminal and includes the second resonator;

each of the first filter and the second filter is a ladder filter that includes a series arm and a parallel arm, each of which includes a plurality of resonators; and the conductive shield layer includes:

a first layer to cover a series arm resonator connected to the third terminal and a parallel arm resonator connected between the series arm resonator and the ground terminal in the second filter; and a second layer isolated from the first layer and covers at least a portion of the resonators of the second filter excluding the series arm resonator and the parallel arm resonator.

4. The acoustic wave device according to claim 3, wherein the first filter is a reception filter; and the second filter is a transmission filter.

5. A communication device comprising:

a transmission and reception circuit including a filter device; wherein the filter device is the acoustic wave device according to claim 1.

6. The acoustic wave device according to claim 1, further comprising:

a support; and a third filter that includes a second piezoelectric substrate including a fifth surface and a sixth surface; and a third resonator on the fifth surface of the second piezoelectric substrate; wherein the outer terminal electrode is on the sixth surface of the second piezoelectric substrate;

the second piezoelectric substrate is supported by the support and spaced apart from the first piezoelectric substrate such that the first surface and the fifth surface face each other; and the conductive shield layer is between the first surface and the fifth surface.

7. The acoustic wave device according to claim 6, wherein the outer terminal electrode further includes a third terminal;

the third filter is connected between the first terminal and the third terminal;

each of the first filter and the third filter is a ladder filter that includes a series arm and a parallel arm, each of which includes a plurality of resonators; and the conductive shield layer includes:

a first layer to cover a series arm resonator connected to the third terminal and a parallel arm resonator connected between the series arm resonator and the ground terminal in the third filter; and a second layer isolated from the first layer and covers at least a portion of the resonators of the third filter excluding the series arm resonator and the parallel arm resonator.

8. The acoustic wave device according to claim 6, wherein the first filter is a reception filter; and the third filter is a transmission filter.

9. The acoustic wave device according to claim 6, wherein a distance between the third resonator and the conductive shield layer in the thickness direction of the first piezoelectric substrate is about 5 μm or more and about 40 μm or less.

10. The acoustic wave device according to claim 1, wherein each resonator is a surface acoustic wave resonator or a bulk acoustic wave resonator.

11. The acoustic wave device according to claim 1, wherein the acoustic wave device is a duplexer including two filters.

12. The acoustic wave device according to claim 1, wherein the first resonator is a surface acoustic wave resonator or a bulk acoustic wave resonator.

13. The acoustic wave device according to claim 3, wherein the second resonator is a surface acoustic wave resonator or a bulk acoustic wave resonator.

14. The acoustic wave device according to claim 1, wherein the first piezoelectric substrate includes lithium tantalate, lithium niobate, zinc oxide, aluminum nitride, lead zirconate titanate, or a piezoelectric laminate material.

15. The acoustic wave device according to claim 1, wherein the first resonator includes a metal including aluminum, copper, silver, gold, titanium, tungsten, platinum, chromium, nickel, or molybdenum, or an alloy of aluminum, copper, silver, gold, titanium, tungsten, platinum, chromium, nickel, or molybdenum.

16. The acoustic wave device according to claim 1, wherein the first resonator includes a plurality of metal films.

17. The acoustic wave device according to claim 1, wherein the conductive shield layer includes copper, silver, or aluminum.

18. The acoustic wave device according to claim 2, wherein the conductive shield layer is located in a hollow space between the first resonator and the cover.

19. The acoustic wave device according to claim 1, wherein the conductive shield layer is connected to the ground terminal.

* * * * *